(12) United States Patent
Loke et al.

(10) Patent No.: US 6,387,798 B1
(45) Date of Patent: May 14, 2002

(54) METHOD OF ETCHING TRENCHES FOR METALLIZATION OF INTEGRATED CIRCUIT DEVICES WITH A NARROWER WIDTH THAN THE DESIGN MASK PROFILE

(75) Inventors: Nelson Chou San Loke, Perak (MY); Mukherjee-Roy Moitreyee; Joseph Xie, both of Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/888,695

(22) Filed: Jun. 25, 2001

(51) Int. Cl.⁷ .......................................... H01L 21/4763
(52) U.S. Cl. ................... 438/623; 438/631; 438/640; 438/643; 438/645; 438/687
(58) Field of Search ................ 438/623, 631, 438/640, 643, 645, 687, 626, 627, 637

(56) References Cited

U.S. PATENT DOCUMENTS

| | | | |
|---|---|---|---|
| 4,729,815 A | 3/1988 | Leung | 156/643 |
| 5,843,846 A | 12/1998 | Nguyen et al. | 438/713 |
| 6,096,655 A | 8/2000 | Lee et al. | 438/700 |
| 6,114,250 A | 9/2000 | Ellingboe et al. | 438/709 |
| 6,136,624 A * | 10/2000 | Kemmochi et al. | 438/30 |
| 6,143,649 A * | 11/2000 | Tang | 438/640 |
| 6,165,898 A | 12/2000 | Jang et al. | 438/638 |
| 6,171,951 B1 * | 1/2001 | Lee et al. | 438/640 |
| 6,211,071 B1 * | 4/2001 | Lukanc et al. | 438/640 |

* cited by examiner

Primary Examiner—Keith Christianson
Assistant Examiner—Stephen W. Smoot
(74) Attorney, Agent, or Firm—George O. Saile; Stephen B. Ackerman; Rosemary L. S. Pike

(57) ABSTRACT

A method of etching trenches through a low-k material layer using a hard mask wherein the trenches are sized down from the mask size by etching without sacrificing a vertical trench profile is described. A low-k dielectric material is provided over a region to be contacted on a substrate. A hard mask layer is deposited overlying the dielectric material. A mask is formed over the hard mask layer wherein the mask has a first opening of a first width. A second opening is etched in the hard mask layer where it is exposed by the mask wherein the second opening has a second width smaller than the first width and wherein the second opening has inwardly sloping sidewalls. A trench is etched through the dielectric layer to the region to be contacted through the second opening whereby the trench has a width equal to the second width. The trench is filled with a metal layer to complete fabrication of the integrated circuit device.

35 Claims, 4 Drawing Sheets

METHOD OF ETCHING TRENCHES FOR METALLIZATION OF INTEGRATED CIRCUIT DEVICES WITH A NARROWER WIDTH THAN THE DESIGN MASK PROFILE

BACKGROUND OF THE INVENTION (1) Field of the Invention

The invention relates to a method of trench etching in the fabrication of integrated circuits, and more particularly, to a method of trench etching where the trenches are sized down from the design mask size by etching in the manufacture of integrated circuits.

(2) Description of the Prior Art

Damascene and dual damascene processes have become a future trend in metallization. Trenches or vias and trenches are etched in an insulating layer. The trenches or vias and trenches are inlaid with metal to complete the contacts. In order to reduce RC delay to a minimum, low dielectric constant materials (k<3) are preferably used as the insulating layer. Trenches or vias and trenches are etched through the low-k film typically using a photoresist mask. At present, ion metal plasma (IMP) can successfully coat a thin film of about 300 Angstroms on the sidewall of a 0.24 μm trench having a 2000 Angstrom top side thickness. Assuming that the overhang percentage of the IMP layer is 5%, this may pose a problem as the trench size shrinks to 0.15 μm or lower. It may not be possible to coat a uniform sidewall thin film for subsequent electrochemical plating processes, for example.

U.S. Pat. No. 6,114,250 to Ellingboe et al and U.S. Pat. No. 6,096,655 to Lee et al teach a via etch through a low-k film using a hard mask. U.S. Pat. No. 6,165,898 to Jang et al discloses a dual-damascene etch using a hard mask. U.S. Pat. No. 4,729,815 to Leung shows a via etch using a hard mask where the via has a gentle slope. U.S. Pat. No. 5,843,846 to Nguyen et al shows an etch to form rounded corners.

SUMMARY OF THE INVENTION

A principal object of the present invention is to provide an effective and very manufacturable method of etching trenches in the fabrication of integrated circuit devices.

Another object of the invention is to provide a method of etching trenches through a low dielectric constant material layer in the fabrication of integrated circuit devices.

Yet another object of the invention is to provide a method of etching trenches through a low-k material layer using a hard mask.

A further object of the invention is to provide a method of etching trenches through a low-k material layer using a hard mask wherein the trenches are sized down from the mask size by etching.

Yet another object of the invention is to provide a method of etching trenches through a low-k material layer using a hard mask wherein the trenches are sized down from the mask size by etching without sacrificing a vertical trench profile.

In accordance with the objects of this invention a method of etching trenches through a low-k material layer using a hard mask wherein the trenches are sized down from the mask size by etching without sacrificing a vertical trench profile is achieved. A low-k dielectric material is provided over a region to be contacted on a substrate. A hard mask layer is deposited overlying the dielectric material. A mask is formed over the hard mask layer wherein the mask has a first opening of a first width. A second opening is etched in the hard mask layer where it is exposed by the mask wherein the second opening has a second width smaller than the first width and wherein the second opening has inwardly sloping sidewalls. A trench is etched through the dielectric layer to the region to be contacted through the second opening whereby the trench has a width equal to the second width. The trench is filled with a metal layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a method to etch trenches through a low dielectric constant material layer using a hard mask. The critical dimension of the trenches can be decreased by the unique etching process of the invention. For example, using a 0.24 μm design mask, the trenches can be sized down to 0.15 or 0.10 μm.

It will be understood by those skilled in the art that the process of the present invention is not limited to the damascene embodiments described in detail herein, but may be used in any application in which it is desired to decrease the critical dimension of trenches without changing a mask.

Figure 1:
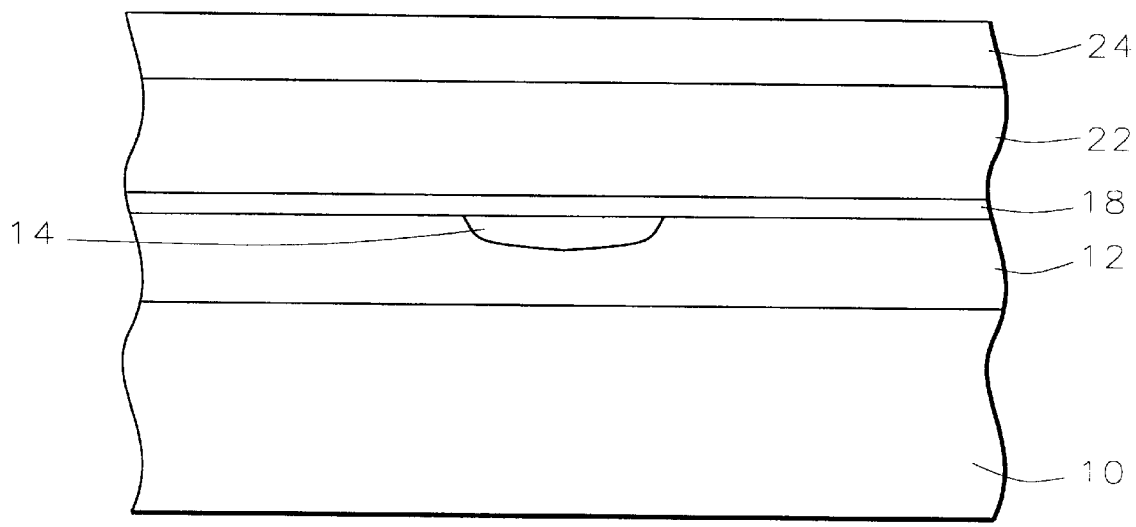
FIGS. 1 through 7 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor device structures, such as gate electrodes and source and drain regions, not shown, may be formed in and on the semiconductor substrate. These semiconductor device structures are covered with an insulating layer such as silicon oxide. A first layer of metallization may also be provided. The semiconductor device structures and insulating layer thereover are represented by 12 in FIG. 1. 14 is a region to be contacted by a damascene process in the illustrated embodiment of the present invention. 14 may be a semiconductor device structure such as a gate electrode or source or drain region or it may be a first metal line, for example. A capping layer 18 may be formed overlying the region 14 to be contacted.

Now, a low dielectric constant material 22 is deposited overlying the substrate. For example, the low-k material may be any spin-on dielectric having a hydrogen carbon base, such as SILK, HOSP, FLARE, and so on, deposited to a thickness of between about 1000 and 10,000 Angstroms. The low-k material should have a dielectric constant of less than 3.

A hard mask layer 24 is deposited over the low-k layer 22. The hard mask layer 24 preferably comprises an undoped silicate glass (USG) layer having a thickness of between about 1000 and 2500 Angstroms. The hard mask may alternatively comprise other materials such as tetraethoxysilane (TEOS) oxide, silicon carbide, silicon nitride, and BLOK.

Figure 2:
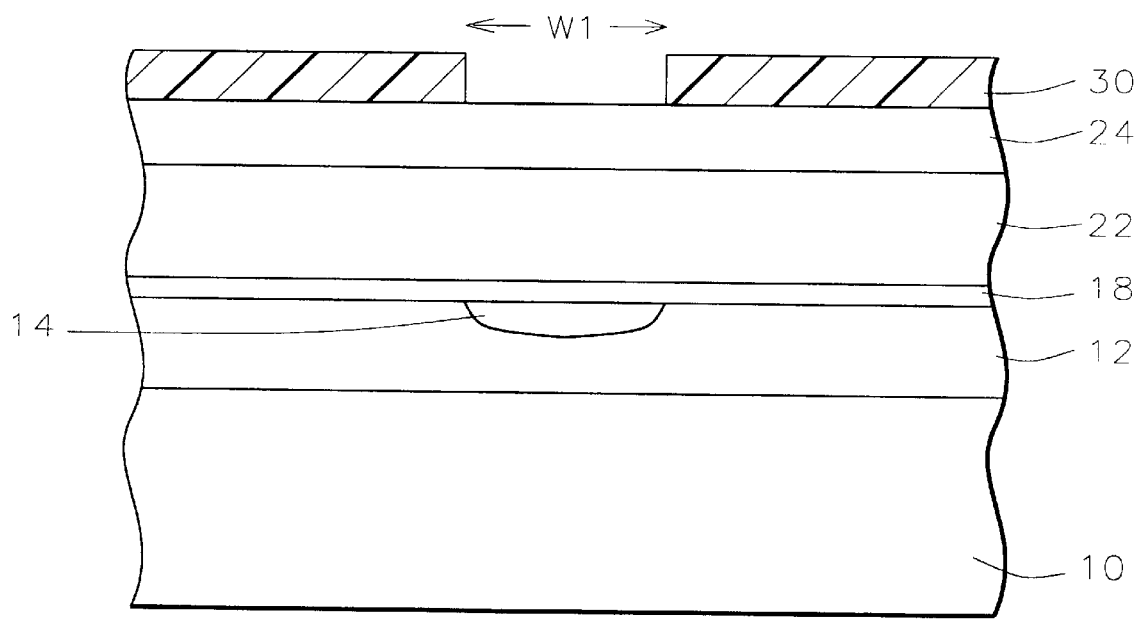

Now the hard mask layer 24 will be patterned using a design mask having a particular sized opening, for example 0.24 μm. For example, a photoresist layer 30 is coated over the hard mask layer and exposed through the reticle. The exposed area is developed away to leave the photoresist mask 30, as shown in FIG. 2. The photoresist mask 30 has an opening of width W1 corresponding to the size of the design mask. The hard mask will be patterned to have a width W2 smaller than the width W1 of the opening in the design mask. This width is the critical dimension. The critical dimension can be adjusted in the hard mask using the same reticle. The final critical dimension is controlled by the hard mask thickness and not by lithography exposure parameters.

Figure 3:
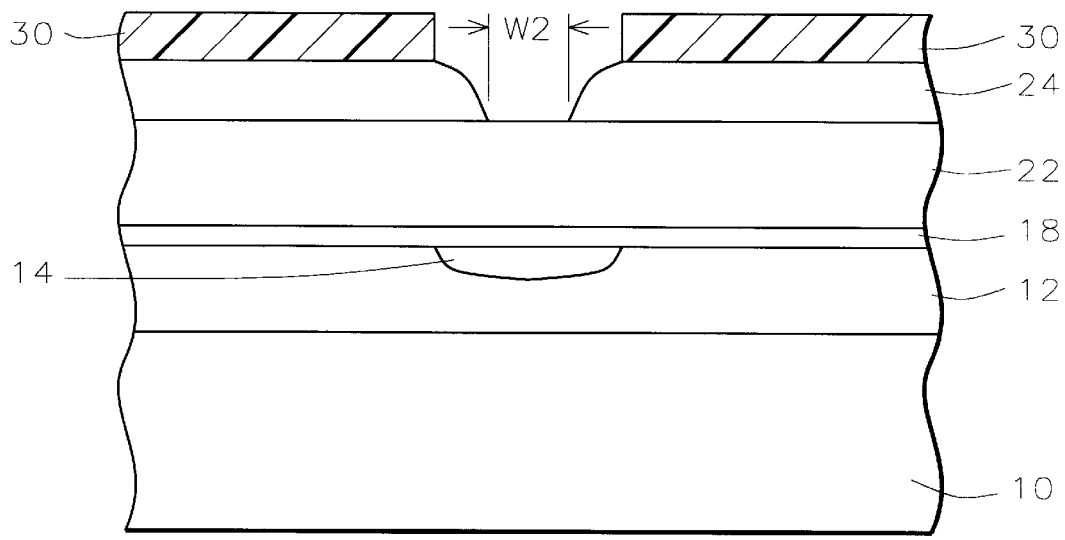

Referring now to FIG. 3, the hard mask 24 is patterned using the novel technique of the present invention. The hard mask is etched using $CF_4$, $O_2$, and Ar at a pressure of between about 30 and 150 mTorr and at a temperature of between about −10 and 10° C. $CF_4$ is flowed about between about 60 and 100 sccm, $O_2$ is flowed at between about 5 and 30 sccm, and Ar is flowed at between about 100 and 200 sccm. Using this recipe, the hard mask is etched through with a smaller width W2 than the width W1 of the opening in the photoresist mask, as shown in FIG. 3. W2 is smaller than W1 because the hard mask material shrinks during etching in low temperature. Conventional oxide etching uses a temperature of about 40° C. The CD shrinkage can be controlled by the hard mask thickness or by reducing the press sure to further shrink the CD.

It is a key feature of the novel etching recipe of the present invention that the wafer chuck has a sub-zero temperature. Based on experience, the sub-zero wafer chuck temperature will result in a substrate temperature of less than about 100° C. Low temperature in the USG etching will cause a higher deposition rate, resulting in the tapered sidewalls illustrated in FIG. 3.

Now, the low-k material is etched through using $N_2$ and $H_2$ chemistry. $N_2$ is flowed at 50 to 250 sccm and $H_2$ is flowed at between about 150 and 350 sccm under a pressure of between about 30 and 200 mTorr at −10 to 10° C. Most preferably, $N_2$ is flowed at 200 sccm and $H_2$ is flowed at 200 sccm under pressure of 160 mTorr at −10° C. THe photoresist mask is removed during etching of the low-k material layer 22.

Figure 4:
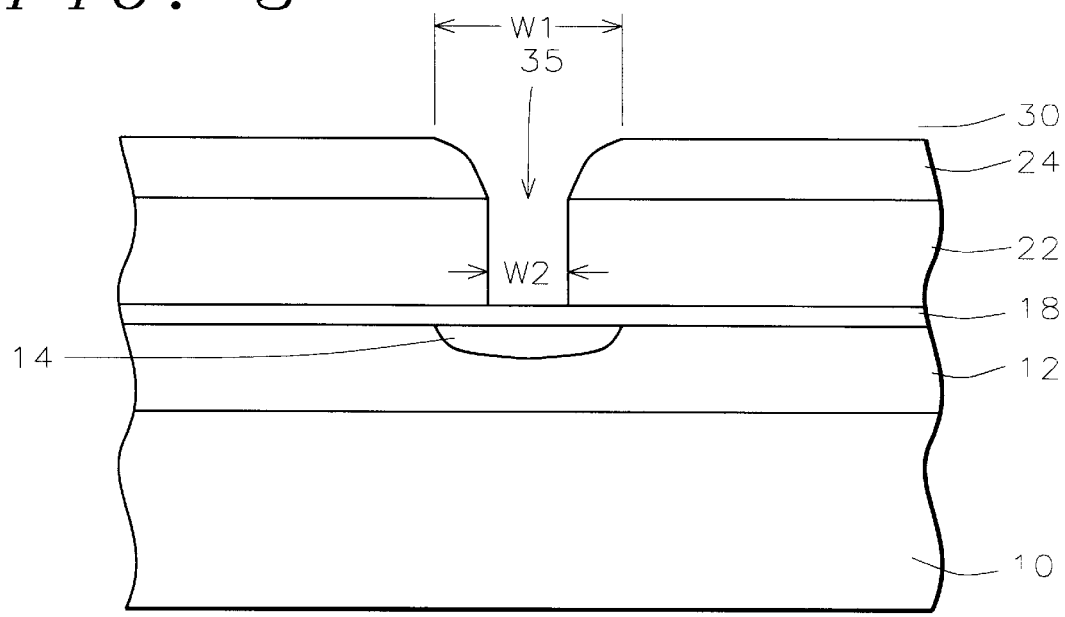

FIG. 4 illustrates the trench 35 etched through the low-k material through the hard mask 24. The low-k material is not undercut in the process of the present invention because sufficient sidewall protecxction is achieved at −10° C. The resulting trench has a critical dimension (width W2) of 0.15 $\mu$m or lower. This critical dimension has been achieved using a reticle with a larger critical dimension W1 of as much as twice the final critical dimension W2 of the trench. Since the critical dimension can be adjusted by the etching recipe of the present invention using the existing reticle, time and cost of making a new reticle is saved every time the critical dimension is reduced.

Figure 5:
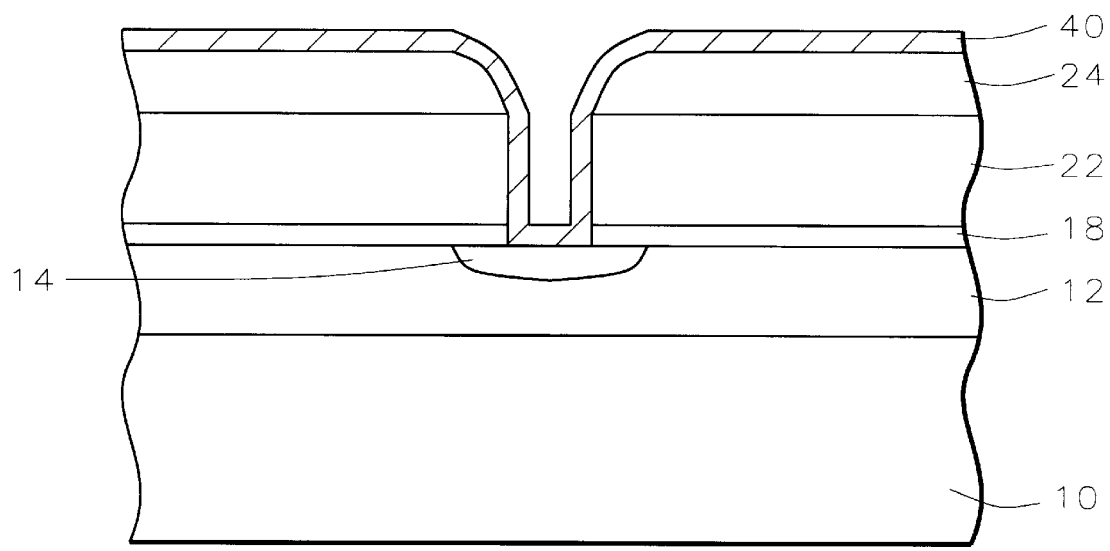

Referring now to FIG. 5, yhe capping layer 18 is etched through as is conventional in the art to provide an opening to the region 14 to be contacted. A barrier metal layer such as tantalum, titanium nitride, or tantalum nitride, not shown, may be deposited conformally within the trench opening. Then, a metal layer will be deposited to fill the trench. For example, a copper layer 40 may be deposited by ion metal plasma (IMP) conformally over the hard mask and within the trench opening. The gentle slope of the hard mask can reduce the effect of the IMP overhang, thus extending the usefulness of IMP to 0.15 to 0.10 $\mu$m technology and beyond.

Figure 6:
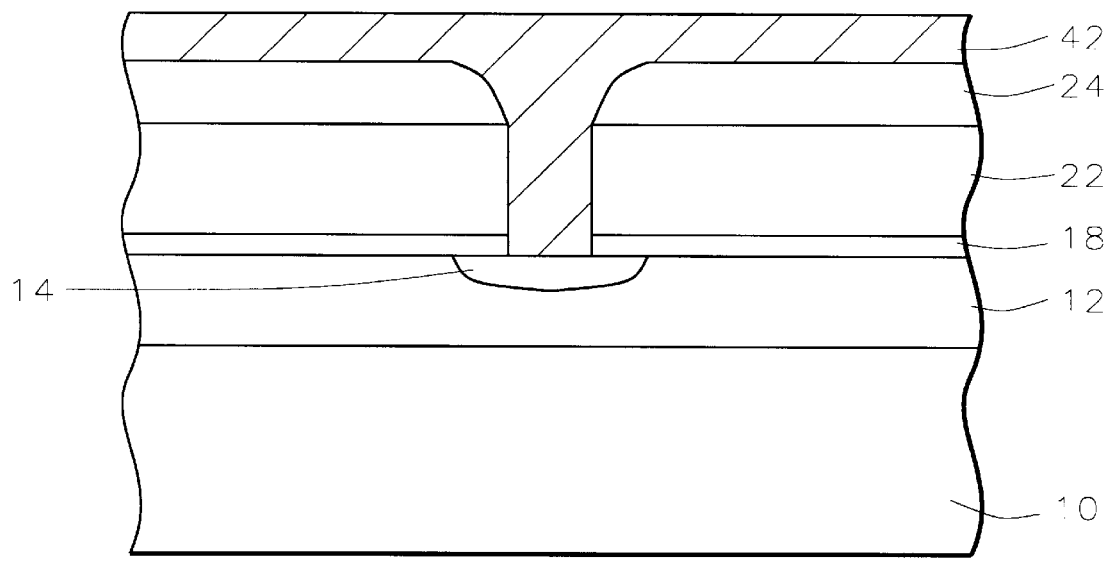
Figure 7:
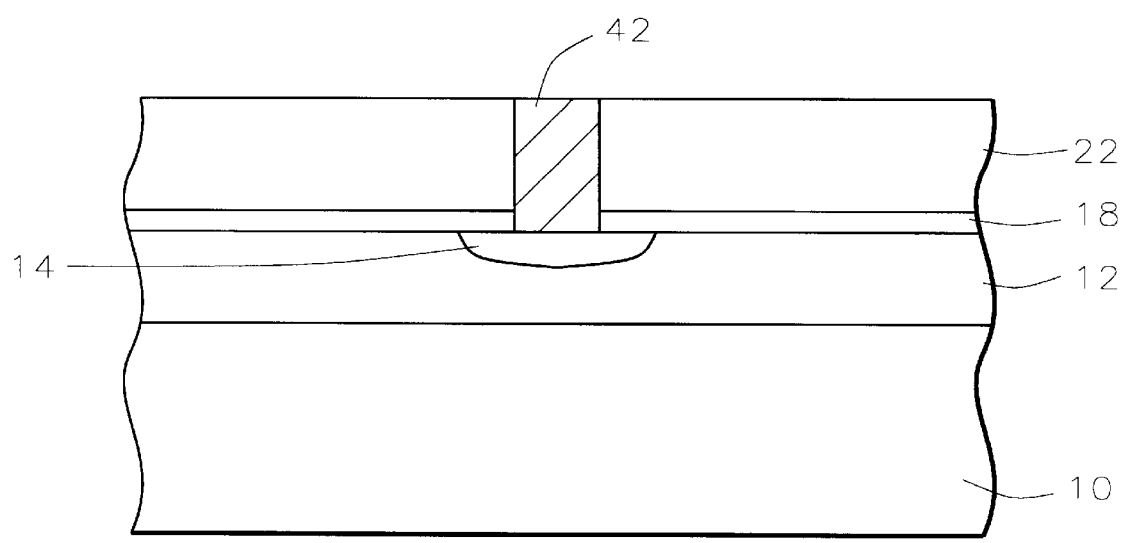

Referring now to FIG. 6, copper 42 is formed within the trench by electrochemical plating, for example. Other methods such as chemical vapor deposition, physical vapor deposition, or electroless plating could be used. The copper is polished back to leave copper 42 only within the trench opening, completing the metal inlay as shown in FIG. 7. A substantial portion of the hard mask will also be removed during the overpolishing step. Processing continues as is conventional in the art to complete fabrication of the integrated circuit device.

The process of the present invention provides a novel etching recipe and technique that will efficiently reduce critical dimension using an existing reticle and scanning system. The unique low temperature process can reduce the critical dimension to as low as 0.15 to 0.10 $\mu$m. A sloped profile is achieved for the hard mask, thus circumventing possible metallization problems.

While the invention has been particularly shown and described with reference to the preferred embodiments thereof, it will be understood by those skilled in the art that various changes in form and details may be made without departing from the spirit and scope of the invention.

What is claimed is:

1. A method of metallization in the fabrication of an integrated circuit device comprising:

providing a dielectric layer over a region to be contacted on a substrate;

depositing a hard mask layer overlying said dielectric layer;

forming a mask over said hard mask layer wherein said mask has a first opening of a first width;

etching a second opening in said hard mask layer where it is exposed by said mask wherein said second opening has a second width smaller than said first width and wherein said second opening has inwardly sloping sidewalls;

etching a trench through said dielectric layer to said region to be contacted through said second opening whereby said trench has a width equal to said second width; and filling said trench with a metal layer and planarizing said metal layer to complete said metallization in said fabrication of said integrated circuit device.

2. The method according to claim 1 further comprising forming semiconductor device structures in and on said substrate wherein said semiconductor device structures are selected from the group consisting of: gate electrodes, source regions, drain regions, and metal lines.

3. The method according to claim 1 wherein said region to be contacted is selected from the group consisting of: a gate electrode, a source/drain region, and a metal line.

4. The method according to claim 1 wherein said dielectric layer is a spin-on dielectric material.

5. The method according to claim 1 wherein said dielectric layer is a spin-on dielectric material having a hydrogen carbon base.

6. The method according to claim 1 wherein said dielectric layer comprises a material having a low dielectric constant of less than about 3.

7. The method according to claim 1 wherein said hard mask layer comprises undoped silicate glass having a thickness of between about 1000 and 2500 Angstroms.

8. The method according to claim 1 wherein said second width is about half of said first width.

9. The method according to claim 1 wherein said first width is about 0.24 $\mu$m and wherein said second width is as small as 0.15 $\mu$m or 0.10 $\mu$m.

10. The method according to claim 1 wherein said step of etching a second opening in said hard mask layer comprises etching with etching gases consisting of: $CF_4$, $O_2$, and Ar at a pressure of between about 30 and 150 mTorr with a wafer chuck temperature of between about −10 and 10° C.

11. The method according to claim 1 wherein said step of etching a trench through said dielectric layer comprises, etching with etching gases consisting of $N_2$ and $H_2$ at a pressure of between about 30 and 200 mTorr with a wafer chuck temperature of between about −10, and 10° C.

12. The method according to claim 1 wherein said step of filling said trench with a metal layer comprises:
   depositing a copper layer by ion metal plasma conformally into said trench;
   filling said trench with copper using an electrochemical plating process; and
   polishing back said copper to complete said filling of said trench.

13. The method according to claim 1 wherein said metal layer comprises copper.

14. The method according to claim 1 wherein said step of filling said trench with a metal layer comprises:
   depositing a barrier metal layer within said trench; and
   depositing said a copper layer overlying said barrier metal layer by one of the group consisting of: chemical vapor deposition, physical vapor deposition, electroless plating, and electrochemical plating.

15. A method of metallization in the fabrication of an integrated circuit device comprising:
   providing a dielectric layer over a region to be contacted on a substrate wherein said dielectric layer has a dielectric constant of less than 3;
   depositing an undoped silicate glass (USG) layer overlying said dielectric layer;
   forming a mask over said USG layer wherein said mask has a first opening of a first width;
   etching a second opening in said USG layer where it is exposed by said mask wherein said second opening has a second width smaller than said first width and wherein said second opening has inwardly sloping sidewalls;
   etching a trench through said dielectric layer to said region to be contacted through said second opening whereby said trench has a width equal to said second width; and
   filling said trench with a metal layer and planarizing said metal layer to complete said metallization in said fabrication of said integrated circuit device.

16. The method according to claim 15 further comprising forming semiconductor device structures in and on said substrate wherein said semiconductor device structures are selected from the group consisting of: gate electrodes, source regions, drain regions, and metal lines.

17. The method according to claim 15 wherein said region to be contacted is selected from the group consisting of: a gate electrode, a source/drain region, and a metal line.

18. The method according to claim 15 wherein said dielectric layer is a spin-on dielectric material having a hydrogen carbon base.

19. The method according to claim 15 wherein said USG layer has a thickness of between about 1000 and 2500 Angstroms.

20. The method according to claim 15 wherein said second width is about half of said first width.

21. The method according to claim 15 wherein said first width is about 0.24 µm and wherein said second width is as small as 0.15 µm or 0.10 µm.

22. The method according to claim 15 wherein said step of etching a second opening in said USG layer comprises etching with the etching gases consisting of: $CF_4$, $O_2$, and Ar at a pressure of between about 30 and 150 mTorr with a wafer chuck temperature of between about −10 and 10° C.

23. The method according to claim 15 wherein said step of filling said trench with a metal layer comprises:
   depositing a copper layer by ion metal plasma conformally into said trench;
   filling said trench with copper using an electrochemical plating process; and
   polishing back said copper to complete said filling of said trench.

24. The method according to claim 15 wherein said metal layer comprises copper.

25. The method according to claim 15 wherein said step of filling said trench with a metal layer comprises:
   depositing a barrier metal layer within said trench; and
   depositing a copper layer overlying said barrier metal layer by one of the group consisting of: chemical vapor deposition, physical vapor deposition, electroless plating, and electrochemical plating.

26. A method of metallization in the fabrication of an integrated circuit device comprising:
   providing a dielectric layer over a region to be contacted on a substrate wherein said dielectric layer has a dielectric constant of less than 3;
   depositing an undoped silicate glass (USG) layer overlying said dielectric layer;
   forming a mask over said USG layer wherein said mask has a first opening of a first width;
   etching a second opening in said USG layer where it is exposed by said mask wherein said second opening has a second width smaller than said first width, wherein said second opening has inwardly sloping sidewalls and wherein said etching is performed using $CF_4$, $O_2$, and Ar gases with a wafer chuck temperature between 10 and 10° C. or below;
   etching a trench through said dielectric layer to said region to be contacted through said second opening whereby said trench has a width equal to said second width; and
   filling said trench with a metal layer and planarizing said metal layer to complete said metallization in said fabrication of said integrated circuit device.

27. The method according to claim 26 further comprising forming semiconductor device structures in and on said substrate wherein said semiconductor device structures are selected from the group consisting of: gate electrodes, source regions, drain regions, and metal lines.

28. The method according to claim 26 wherein said region to be contacted is selected from the group consisting of: a gate electrode, a source/drain region, and a metal line.

29. The method according to claim 26 wherein said dielectric layer is a spin-on dielectric material having a hydrogen carbon base.

30. The method according to claim 26 wherein said USG layer has a thickness of between about 1000 and 2500 Angstroms.

31. The method according to claim 26 wherein said second width is about half of said first width.

32. The method according to claim 26 wherein said first width is about 0.24 µm and wherein said second width is as small as 0.15 µm or 0.10 µm.

33. The method according to claim 26 wherein said step of filling said trench with a metal layer comprises:

depositing a copper layer by ion metal plasma conformally into said trench;

filling said trench with copper using an electrochemical plating process; and polishing back said copper to complete said filling of said trench.

34. The method according to claim 26 wherein said metal layer comprises copper.

35. The method according to claim 26 wherein said step of filling said trench with a metal layer comprises:
   depositing a barrier metal layer within said trench; and
   depositing a copper layer overlying said barrier metal layer by one of the group consisting of: chemical vapor deposition, physical vapor deposition, electroless plating, and electrochemical plating.

* * * * *

UNITED STATES PATENT AND TRADEMARK OFFICE
CERTIFICATE OF CORRECTION

PATENT NO. : 6,387,798 B1
DATED : May 14, 2002
INVENTOR(S) : Nelson Chou San Loke, Moitreyee Mukherjee-Roy and Joseph Xie It is certified that error appears in the above-identified patent and that said Letters Patent is hereby corrected as shown below:

<u>Title page,</u>
Item [75], delete "Mukherjee-Roy Moitreyee", and replace with -- Moitreyee Mukherjee-Roy --.

Signed and Sealed this

Third Day of September, 2002

Attest:

Attesting Officer

JAMES E. ROGAN
Director of the United States Patent and Trademark Office